(12) United States Patent
Wang et al.

(10) Patent No.: US 7,523,650 B2
(45) Date of Patent: *Apr. 28, 2009

(54) MULTIFUNCTIONAL PROBE ARRAY SYSTEM

(75) Inventors: Xuefeng Wang, Schenectady, NY (US); Chang Liu, Champaign, IL (US)

(73) Assignee: The Board of Trustees of the University of Illinois, Urbana, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 11/779,637

(22) Filed: Jul. 18, 2007

(65) Prior Publication Data

US 2007/0289369 A1    Dec. 20, 2007

Related U.S. Application Data

(62) Division of application No. 11/234,401, filed on Sep. 23, 2005, now Pat. No. 7,281,419.

(60) Provisional application No. 60/719,158, filed on Sep. 21, 2005.

(51) Int. Cl.
 *G01B 5/28* (2006.01)
(52) U.S. Cl. .......................... 73/105; 250/306
(58) Field of Classification Search ............. 73/105; 250/306
See application file for complete search history.

(56) References Cited

U.S. PATENT DOCUMENTS

| 5,053,100 A | 10/1991 | Hayes et al. |
| 5,221,415 A | 6/1993 | Albrecht et al. |
| 5,514,501 A | 5/1996 | Tarlov |
| 5,610,898 A | 3/1997 | Takimoto et al. |
| 5,883,387 A | 3/1999 | Matsuyama et al. |
| 5,922,214 A | 7/1999 | Liu et al. |
| 5,923,637 A | 7/1999 | Shimada et al. |
| 6,156,215 A | 12/2000 | Shimada et al. |
| 6,284,113 B1 | 9/2001 | Bjornson et al. |
| 6,291,140 B1 | 9/2001 | Andreoli et al. |
| 6,353,219 B1 | 3/2002 | Kley |

(Continued)

FOREIGN PATENT DOCUMENTS

EP    0786642 A1    7/1997

(Continued)

OTHER PUBLICATIONS

Kim et al., "A novel AFM Chip for fountain pen nanolithography—design and microfabrication," Mat. Res. Soc. Symp. Proc., vol. 782, pp. A5.56.1-A5.56.6, 2004.

(Continued)

*Primary Examiner*—Daniel S Larkin
(74) *Attorney, Agent, or Firm*—Evan Law Group LLC

(57) ABSTRACT

A probe array for includes a handle, a first probe and a second probe. The first probe has a first shank, connected to the handle, and a first tip; and the second probe has a second shank, connected to the handle, and second tip. The first tip contains a different material from the second tip. The probe array may be used to write on a surface by contacting the first tip with a surface, where a first ink is on the first tip. This writing method may further include lifting the first tip from the surface and contacting the second tip with the surface.

16 Claims, 7 Drawing Sheets

U.S. PATENT DOCUMENTS

| | | | |
|---|---|---|---|
| 6,409,900 | B1 | 6/2002 | Parce et al. |
| 6,429,025 | B1 | 8/2002 | Parce et al. |
| 6,444,111 | B1 | 9/2002 | Montgomery |
| 6,555,389 | B1 | 4/2003 | Ullman et al. |
| 6,635,311 | B1 | 10/2003 | Mirkin et al. |
| 6,642,129 | B2 | 11/2003 | Liu et al. |
| 6,827,979 | B2 | 12/2004 | Mirkin et al. |
| 6,867,443 | B2 | 3/2005 | Liu et al. |
| 6,943,417 | B2 | 9/2005 | Boland et al. |
| 7,034,854 | B2 | 4/2006 | Cruchon-Dupeyrat et al. |
| 7,042,828 | B2 | 5/2006 | Kley |
| 7,081,624 | B2 | 7/2006 | Liu et al. |
| 7,217,396 | B2 | 5/2007 | Liu et al. |
| 7,281,419 | B2 * | 10/2007 | Wang et al. .................... 73/105 |
| 7,344,756 | B2 | 3/2008 | Mirkin et al. |
| 2001/0020588 | A1 | 9/2001 | Adourian et al. |
| 2001/0036674 | A1 | 11/2001 | Indermuhle et al. |
| 2002/0025279 | A1 | 2/2002 | Weigl et al. |
| 2002/0123153 | A1 | 9/2002 | Moon et al. |
| 2003/0017077 | A1 | 1/2003 | Hahn et al. |
| 2003/0026740 | A1 | 2/2003 | Staats |
| 2003/0049381 | A1 | 3/2003 | Mirkin et al. |
| 2003/0082080 | A1 | 5/2003 | Zimmermann et al. |
| 2004/0007053 | A1 | 1/2004 | Lutter et al. |
| 2004/0018116 | A1 | 1/2004 | Desmond et al. |
| 2004/0175631 | A1 | 9/2004 | Crocker et al. |
| 2004/0223886 | A1 | 11/2004 | Liu et al. |
| 2004/0226464 | A1 | 11/2004 | Mirkin et al. |
| 2004/0228962 | A1 | 11/2004 | Liu et al. |
| 2005/0201257 | A1 | 9/2005 | Champion et al. |
| 2005/0236566 | A1 | 10/2005 | Liu |
| 2007/0163647 | A1 | 7/2007 | Liu et al. |
| 2007/0289369 | A1 | 12/2007 | Wang et al. |

FOREIGN PATENT DOCUMENTS

| | | |
|---|---|---|
| EP | 1 359 388 | 11/2003 |
| EP | 1388369 A2 | 2/2004 |
| WO | WO 99/56176 | 11/1999 |
| WO | WO 00/41213 | 7/2000 |
| WO | WO 01/91855 A1 | 12/2001 |
| WO | WO 2004/103886 A2 | 12/2004 |
| WO | WO 2004/105046 A2 | 12/2004 |
| WO | WO 2005/114673 A1 | 12/2005 |
| WO | WO 2007/037998 A1 | 4/2007 |

OTHER PUBLICATIONS

Xu et al., "Microfabricated quill-type surface patterning tools for the creation of biological micro/nano arrays," Biomedical Microdevices 6:2, pp. 117-123, 2004.

Deladi et al., "Micromachined fountain pen for atomic force microscope-based nanopatterning," Applied Physics Letters, vol. 85, No. 22, pp. 5361-5363, 2004.

Lewis et al., "Fountain pen nanochemistry: atomic force control of chrome etching," Applied Physics Letters, vol. 75, No. 17, pp. 2689-2691, 1999.

Baldock et al., "Microfabricated Devices for Chemical and Biochemical Analysis Systems," located at http://www.in.umist.ac.uk/, presented at Microsystems 2010, Daresbury, Cheshire, 1 page, 2000.

Belaubre et al., "Fabrication of Biological Microarrays Using Microcantilevers", Applied Physics Letters, vol. 82, pp. 3122-3124, 2003.

Branch et al., "Microstamp Patterns of Biomolecules for High Resolution Neuronal Networks," Medical and Biological Engineering and Computing, vol. 36. pp. 135-141, 1998.

Brittain et al., "Soft Lithography and Microfabrication," Physics World, 11, pp. 31-36, 1998.

Bullen et al., "Micromachined Arrayed Dip Pen Nanolithography (DPN) Probes for Sub-100 nm Direct Chemistry Patterning", presented at 16th International Conference on Micro Electro Mechanical Systems (MEMS), Kyoto, Japan, pp. 4-7, 2003.

Bullen et al., "Thermo-Mechanical Optimization of Thermally Actuated Cantilever Arrays,", Proc. SPIE vol. 4700, Smart Structures and Materials 2002: Smart Electronics, MEMS, and Nanotechnology, pp. 288-295; Jul. 2002.

Chow et al., "Characterization of a Two-Dimensional Cantilever Array with Through-Wafer Electrical Interconnects", Applied Physics Letters, vol. 80, pp. 664-666, 2002.

Cooper et al., "Terabit-Per-Square-Inch Data Storage With the Atomic Force Microscope", Applied Physics Letters, vol. 75, pp. 3566-3568, 1999.

Bullen et al., "Design, Fabrication, and Characterization of Thermally Actuated Probe Arrays for Dip Pen Nanolithography," J. Microelectromechanical Systems, vol. 13, No. 4, pp. 594-602, Aug. 2004.

Hertel et al., "Manipulation of Individual Carbon Nanotubes and Their Interaction with Surfaces", Journal of Physical Chemistry B, vol. 102, pp. 910-915, 1998.

Higa et al., "Fabrication of Microcantilever with a Silicon Tip Prepared by Anodization", Japanese Journal of Applied Physics, vol. 37, Part 1, No. 12B, pp. 7078-7080, 1998.

Hong et al., "A nanoplotter with both parallel and serial writing capabilities," Science, vol. 288, pp. 1808-1811, 2000.

International Search Report and Written Opinion for PCT Application No. PCT/US04/13974, 9 pages, dated Nov. 30, 2005.

International Search Report for PCT Application No. PCT/US2004/015161, 7 pages, dated Feb. 10, 2005.

Jo et al., "Thee-Dimensional Micro-Channel Fabrication in Polydimethylsiloxane (PDMS) Elastomer," J. Microelectrochemical Systems, vol. 9, pp. 76-81, 2000.

Ryu et al., "Precision Patterning of PDMS Thin Films: A New Fabrication Method and Its Applications," Sixth International Symposium on Micro Total Analysis System (mTAS), Nara, Japan, 3 pages, Nov. 2002.

Wang et al., "Multifunctional probe array for nano patterning and imaging," Nano Letters, vol. 5, No. 10, pp. 1867-1872, 2005.

Khoo et al., "Micro Magnetic Silicone Elastomer Membrane Actuator," Sensors and Actuators. A, 89, pp. 259-266, 2001.

Sawchyn, "Integrated Circuits", Kirk-Othmer Encyclopedia of Chemical Technology, vol. 14, pp. 677-709, 1995.

Kumar et al., "Patterning Self-Assembled Monolayers: Applications in Materials Science", Langmuir, 10, pp. 1498-1511, 1994.

Libioulle et al., "Contact-Inking Stamps for Microcontact Printing of Alkanethiols on Gold," Langmuir, vol. 15, pp. 300-304, 1999.

Liu et al., "Mass-Producible Monolithic Silicon Probes for Scanning Probe Microscopes", Sensors and Actuators A, vol. 71, pp. 233-237, 1998.

Lopez et al., "Fabrication and Imaging of Two-Dimensional Patterns of Proteins Adsorbed on Self-Assembled Monolayers by Scanning Electron Microscopy," Journal of American Chemical Society, vol. 115, pp. 10774-10781, 1993.

Lutwyche et al., "5x5 2D AFM Cantilever Arrays A First Step Towards A Terabit Storage Device", Sensors and Actuators A, vol. 73, pp. 89-94, 1999.

Marzolin et al., "Patterning of a Polysiloxane Precursor to Silicate Glasses By Microcontact Printing," Thin Solid Films, vol. 315, pp. 9-12, 1998.

Minne et al., "Centimeter Scale Atomic Force Microscope Imaging and Lithography", Applied Physics Letters, vol. 73, No. 12, pp. 1742-1744, 1998,.

Minne et al., "Parallel Atomic Force Microscopy Using Cantilevers with Integrated Piezoresistive Sensors and Integrated Piezoelectric Actuators", Applied Physics Letters, vol. 67 (26), pp. 3918-3920, 1995.

Niklaus, "Void-Free Full Wafer Adhesive Bonding", presented at MEMS'00, Miyazaci, Japan, pp. 323-328, Jan. 23-27, 2000.

International Search Report and Written Opinion for PCT Application No. PCT/US20006/035826, 13 pages, dated Dec. 19, 2006.

Petersen, "Silicon As A Mechanical Material", Proceedings of the IEEE, vol. 70, No. 5, pp. 420-457, 1982.

Pierret, Semiconductor Device Fundamentals, Table 1.1, Addison-Wesley, p. 4 (3 pages total), 1995.

Piner et al., "'Dip-Pen' Nanolithography", Science, vol. 283, pp. 661-663, 1999.

Snow et al., "Nanofabrication with Proximal Probes", Proceedings of the IEEE, vol. 85, No. 4, pp. 601-611, 1997.

Van Zant, "Microchip Fabrication: A Practical Guide to Semiconductor Processing," Chapter 16 Semiconductor Devices and Integrated Circuit Formation, pp. 491-529, 2000.

Vettiger et al., "Ultrahigh density, high-data-rate NEMS-based AFM data storage system", Microelectronic Engineering, vol. 46, pp. 11-17, 1999.

Wang et al., "Scanning Probe Contact Printing", Langmuir, vol. 19, pp. 8951-8955, 2003.

Wang et al., "Scanning Probe with Elastomeric (PDMS) Tip for Scanning Probe Microcontact Printing (SP-CP)", presented at the 12$^{th}$ International Conference on Solid-State Sensors, Actuators and Microsystems, Boston, MA, 1003-1006, 2003.

Wilson et al., "Surface Organization and Nanopatterning of Collagen by Dip-Pen Nanolithography", PNAS, vol. 98, No. 24, pp. 13660-13664, 2001.

Wang et al., "Scanning probe lithography tips with spring-on tip designs: Analysis, fabrication, and testing", Applied Physics Letters, 87, 054102-1 to 054102-3, 2005.

Wu et al., "Origin of Nanomechanical Cantilever Motion Generated from Biomolecular Interactions", PNAS, vol. 98, No. 4, pp. 1560-1564, 2001.

Xia et al., "Soft Lithography," Annual Review of Material Science, vol. 28, pp. 153-184, 1998.

Zhang et al., "A MEMS Nanoplotter with High-Density Parallel Dip-Pen Nanolithography Probe Arrays", Nanotechnology, vol. 13, pp. 212-217, 2002.

Zou et al., "A mould-and-transfer technology for fabricating scanning probe microscopy probes," Journal of Micromechanics and Microengineering, vol. 14, pp. 204-211, 2004.

Wang et al., "Thermally actuated probe array for parallel dip-pen nanolithography," J. Vac. Sci. Technol. B., 22(6), pp. 2563-2567, 2004.

Zhang et al., "Passive and Active Probe Arrays for Dip-Pen Nanolithography," First IEEE Conference on Nanotechnology, Maui, HI, 5 pages, 2001.

Hong et al., "Multiple Ink Nanolithography: Toward a Multiple-Pen Nano-Plotter", Science, vol. 286, pp. 523-525, 1999.

Horber, J.K.H. et al., "Scanning probe evolution in biology", Science, vol. 302, pp. 1002-1005, (2003).

Smith, J.R. et al, "An overview to scanning probe microscopy", adapted from Educ. Chem, vol. 34, No. 4, pp. 107-111, (1997).

* cited by examiner

MULTIFUNCTIONAL PROBE ARRAY SYSTEM

REFERENCE TO RELATED APPLICATIONS

This application is a divisional application of U.S. application Ser. No. 11/234,401, filed Sep. 23, 2005 now U.S. Pat. No. 7,281,419, incorporated herein by reference, which claims the benefit of U.S. Provisional Application Ser. No. 60/719,158, entitled "Multifunctional Probe Array System", filed Sep. 21, 2005.

FEDERALLY SPONSORED RESEARCH OR DEVELOPMENT

The subject matter of this application may have been funded in part under a research grant from the National Science Foundation, under NSF Grant Number EEC-0118025. The U.S. Government may have rights in this invention.

BACKGROUND

In recent years, scanning probe microscopy (SPM) techniques have been widely used for nanolithography applications. The scanning probe in an SPM instrument can be used to modify a surface with nanoscale resolution through direct or indirect approaches. Direct scanning probe lithography (SPL) methods, including dip pen nanolithography (DPN) and scanning probe contact printing (SPCP), allow deposition of a variety of chemical and biological materials with high resolution and multi-layer registration capability. DPN uses a sharp, coated atomic force microscope (AFM) tip to transfer molecules onto a solid surface. It has been used to generate images with feature sizes smaller than 100 nanometers (nm). SPCP uses a probe having an elastomeric tip to print images on a surface. Typically, an ink is first absorbed into the elastomeric tip, and each contact of the tip on the surface transfers the ink, creating a pixel print. Images can be generated by SPCP in a dot-matrix manner.

In conventional probe-based nanolithography, a single probe typically is used for both writing and reading. This creates a risk of cross-contamination during use. Although it is possible to switch the probes between writing and reading runs, this practice can be inefficient due to the time required to register the writing and reading probes with nanometer resolution. For future nanotechnology applications, it is desirable to perform a wide variety of different lithography and microscopy operations without having to switch probes and perform multiple registrations.

SUMMARY

In one aspect, the invention provides a probe array, including a handle; a first probe having a first shank, connected to the handle, and a first tip; a second probe having a second shank, connected to the handle, and second tip. The first tip contains a different material from the second tip.

In another aspect, the invention provides a method of writing using the probe array, including contacting the first tip with a surface, where a first ink is on the first tip. The method may further include lifting the first tip from the surface and contacting the second tip with the surface.

In yet another aspect, the invention provides a method of making the probe array, including forming at least two tip cavities in a substrate; forming a release layer on the substrate and cavities; forming a shank layer on the release layer; etching the shank layer in at least one tip cavity to form at least one etched cavity; forming a tip in at least one etched cavity; attaching the shank layer to a handle to form the probe array; and releasing the array from the substrate.

In yet another aspect, the invention provides a method of integrating at least one scanning probe contact printing probe and at least one dip pen nanolithography probe.

In yet another aspect, the invention provides a method of integrating at least one scanning probe contact printing probe and at least one atomic force microscopy probe.

BRIEF DESCRIPTION OF THE DRAWINGS

The invention can be better understood with reference to the following drawings and description. The components in the figures are not necessarily to scale, emphasis instead being placed upon illustrating the principles of the invention.

DETAILED DESCRIPTION

The present invention makes use of the discovery that a probe array containing at least two probes having tips of different materials can be a multifunctional array for writing and/or reading images on a surface. It has been found that these multifunctional probe arrays may be used to write complex images using two or more types of writing tips and to read the images formed using the same array. Thus, a wide variety of scanning probe lithography operations may be performed with minimal cross-contamination, improved ease and efficiency of operation, and increased registration accuracy.

The present invention also makes use of the discovery that probes having at least two tips made of different materials may be formed in a single fabrication process on a substrate chip. By forming rigid tips and elastomeric tips in close proximity on a single substrate, these two different types of tips may be integrated into a multifunctional probe array in an efficient and precise manner.

Figure 1:
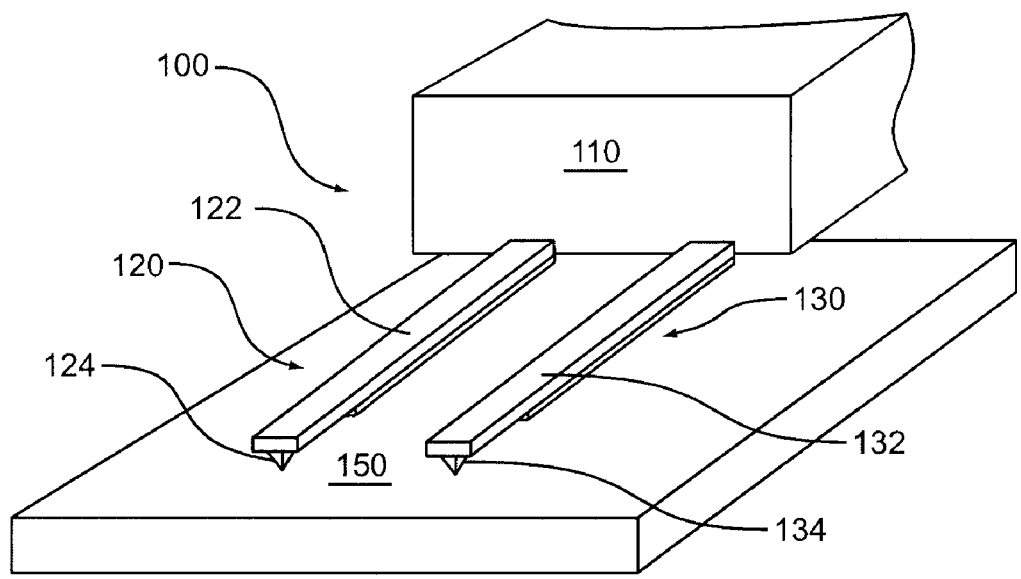
FIG. 1 is a schematic representation of an example of a multifunctional probe array.

FIG. 1 is a schematic representation of an example of a multifunctional probe array 100. Multifunctional probe array 100 includes a handle 110, a first probe 120, and a second probe 130. The first probe 120 includes a first shank 122 connected to the handle 110, and a first tip 124. The second probe 130 includes a second shank 132 connected to the handle 110, and a second tip 134. The first tip 124 and second tip 134 are made of different materials. The array 100 may be used to write an image on surface 150 and may also be used to read the image on the surface.

The probes 120 and 130 each include a tip, 124 or 134, connected to its respective shank. The tip may be positioned at any point along the shank. Preferably the tip is at the distal end of the shank, opposite the proximal end that is connected to the handle. The material composition of a probe tip can be varied, and is related to the intended function of the probe. AFM reading probes and DPN writing probes typically are made of a rigid material. Examples of rigid materials include semiconductors such as silicon; metals such as permalloy, copper, tungsten, titanium, aluminum, silver, and gold; ceramics such as silicon dioxide, silicon oxide, silicon oxynitride, silicon nitride and titanium nitride; and polymers such as polyimide, poly(para-xylylene) ('parylene'), and SU-8 epoxy photoresists. In contrast, SPCP writing probes typically are made of an elastomer. Elastomers are a class of polymers, and examples of elastomers include polysiloxanes, such as polydimethylsiloxane ('PDMS'); and polyolefins, such as polybutadiene, polyisoprene and poly(ethylene-co-propylene-co-diene) ('EPDM').

Referring again to FIG. 1, a multifunctional probe array having a rigid tip and an elastomeric tip can perform two distinct functions. The probe having a rigid tip can be used for reading by AFM or for writing by DPN, and the probe having an elastomeric tip can be used for writing by SPCP. Thus, a single multifunctional array can be used to write an image and read the image, or the array can be used to form an image through the combination of two different types of writing. The distance between probe tips is predetermined and may be accurately maintained through the fabrication process. Since the tip-to-tip distance is known, actions from multiple tips may be spatially coordinated.

The size and shape of a probe tip can be varied. Reading probes typically have sharp tips, such as the point of a pyramid or a cone, to allow for resolution that is as small as possible. Writing probes may have a variety of shapes, depending on the feature sizes of the image to be formed. A sharp writing tip may allow for smaller feature sizes, since the imaging ink is applied at a smaller point on the surface. A blunt writing tip may allow for larger feature sizes to be written rapidly, without the need for multiple applications of the writing tip in close proximity. Examples of writing probe tip shapes include pyramids, cones, wedges, flat-topped pyramids, cylinders, and rectangular prisms. DPN writing probes typically have a sharp point with a curvature radius less than 300 nm, preferably from 200 nm to 1 nm, and more preferably from 100 nm to 10 nm. A variety of probe tip shapes for writing or reading are disclosed, for example, in U.S. Patent Application Publication 2004/0227075 A1, which is incorporated herein by reference.

A multifunctional probe array may include additional probes, each of which independently may be the same as or different from one or both of the first and second probes. In one example, a multifunctional probe array includes at least one AFM probe, at least one DPN probe and at least one SPCP probe. This type of array may write complex images having two or more feature sizes and can read the image produced. This type of array may write and read images having two or more distinct substances at different points within the image. For example, the ink for the SPCP probe may be different from the ink for the DPN probe.

The probes 120 and 130 each include a shank (122 or 132, respectively) connected to the handle. The shank supports the tip of the probe and connects the tip to the handle. Examples of typical shank materials include silicon; metals such as permalloy, copper, tungsten, titanium, aluminum, silver, and gold; oxides such as silicon dioxide, silicon oxide, and silicon oxynitride; nitrides such as silicon nitride and titanium nitride; and polymers such as polyimide, parylene, and SU-8 epoxy. The shank may have a variety of shapes, including a cantilever or a rod. In one example, a rectangular cantilever shank has a length from 100 to 1,000 micrometers, a width from 10 to 500 micrometers, and a thickness from 1 to 10 micrometers. The shank may include shaped elements that allow for an increase or decrease in the flexibility of the shank.

The orientation of the shank relative to the handle may be fixed, or it may be adjustable. A probe having a shank with a fixed orientation relative to the handle is a passive probe, in which the height of the probe tip relative to the surface is controlled by the position of the handle. A probe having a shank with an adjustable orientation is an active probe, in which the height of the probe tip relative to the surface can be controlled by changing the orientation of the shank relative to the handle. Preferably a multifunctional probe array includes one or more active probes. More preferably a multifunctional probe array includes active probes that are individually controllable. Arrays including probes having individually adjustable orientations are disclosed, for example in Zhang, M.; Bullen, D.; Ryu, K.; Liu, C.; Hong, S.; Chung, S.; Mirkin, C. "Passive and Active Probes for Dip Pen Nanolithography," First IEEE Conference on Nanotechnology, October 28-30, Maui, Hi. (2001), and in U.S. Pat. No. 6,642,129 B2, which is incorporated herein by reference.

The shank of an active probe includes an actuator that changes the orientation of the shank relative to the handle based on a signal, preferably an electrical signal. Examples of actuators that may be integrated into a shank include electrostatic actuators, piezoelectric actuators, and thermal actuators. In a typical electrostatic actuator, a first electrode is present on the shank, and a second, oppositely charged, electrode is separated from the shank by a spacer. These two electrodes may generate an electrostatic attraction force upon application of an actuation voltage. In a typical piezoelectric actuator, a piezoelectric material is present on the probe shank. Electrically induced mechanical strain may be used to change the orientation of the shank, displacing the probe tip relative to the surface. This piezoelectric approach is normally used to obtain small dimensional changes in shank orientation.

Preferably each probe shank includes a thermal actuator. Thermal actuation may offer advantages over other modes of actuation due to its simplicity of materials, large actuation force, and low voltage operation. Thermal actuation of probes in an array is disclosed, for example, in Wang, X.; Bullen, D. A.; Zou, J.; Liu, C.; Mirkin, C. A. *J. Vac. Sci. Technol. B* 2004, 22(6), 2563-2567. Typical thermal actuators include two layers of material, where each material has a different thermal expansion coefficient. In one example, the shank material is one of the two layers, and the other layer is a resistive heating material. Examples of resistive heating materials include thin film metal layers. Preferably the force on the shank due to the difference in thermal expansion is sufficient to overcome adhesion forces between the tip and the surface and to lift the probe tip from the surface.

Figure 2:
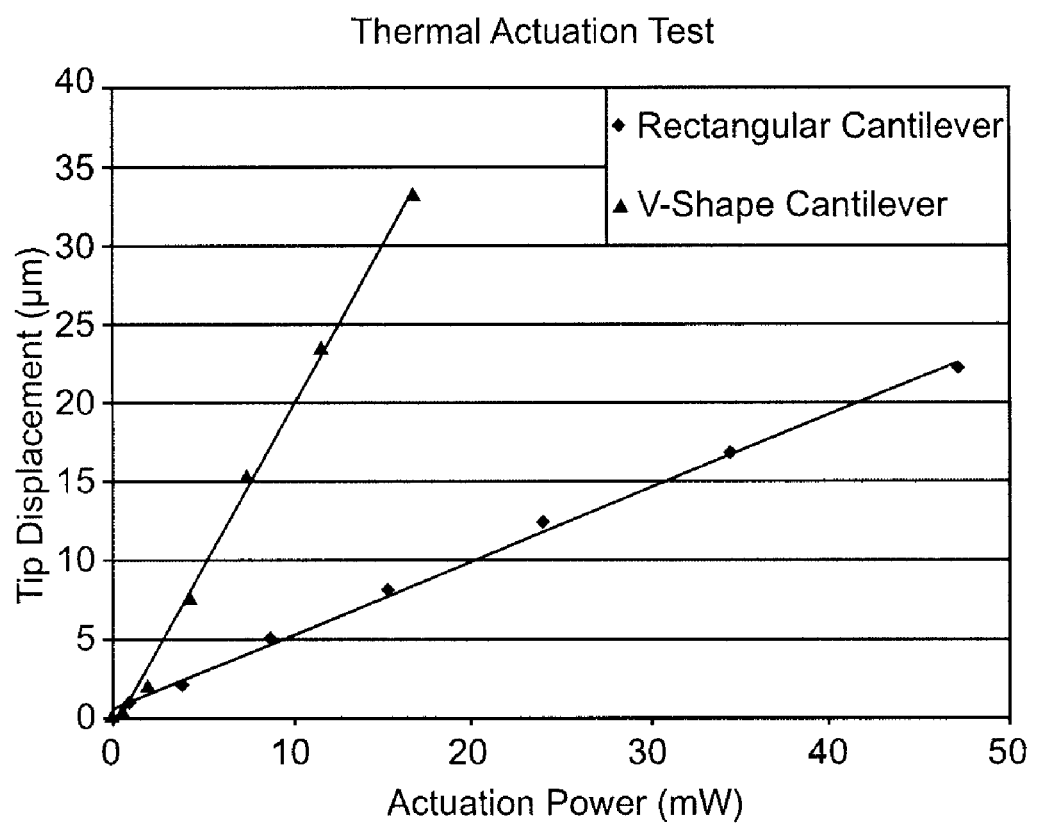
FIG. 2 is a graph of tip displacement as a function of electrical power input for two types of probe cantilevers.

The shape and configuration of the shank may affect the actuation performance. FIG. 2 is a graph of tip displacement as a function of electrical power input for a rectangular cantilever and for a V-shaped cantilever, each of which include a thermal actuator. The tip displacement increased linearly with increasing actuation power for each shank; however, the V-shaped shank had a larger thermal displacement than the rectangular shank at same actuation power. The V-shaped shank had a thinner resistive heater than the rectangular shank, and thus had a higher induced temperature on the shank for the same input power.

The handle 110 may be any material that can connect the probes to a controller, such as an AFM instrument. Movement of the handle by the controller results in translation of the probes in the x-, y- and/or z-direction relative to a surface. For a probe array that includes one or more active probes, the handle preferably includes one or more conductive paths connecting the probe actuator(s) to the controller. Preferably, the handle is a semiconductor wafer that includes a separate conductive path for each active probe in the array. This type of handle may be referred to as a holder chip.

Figure 3:
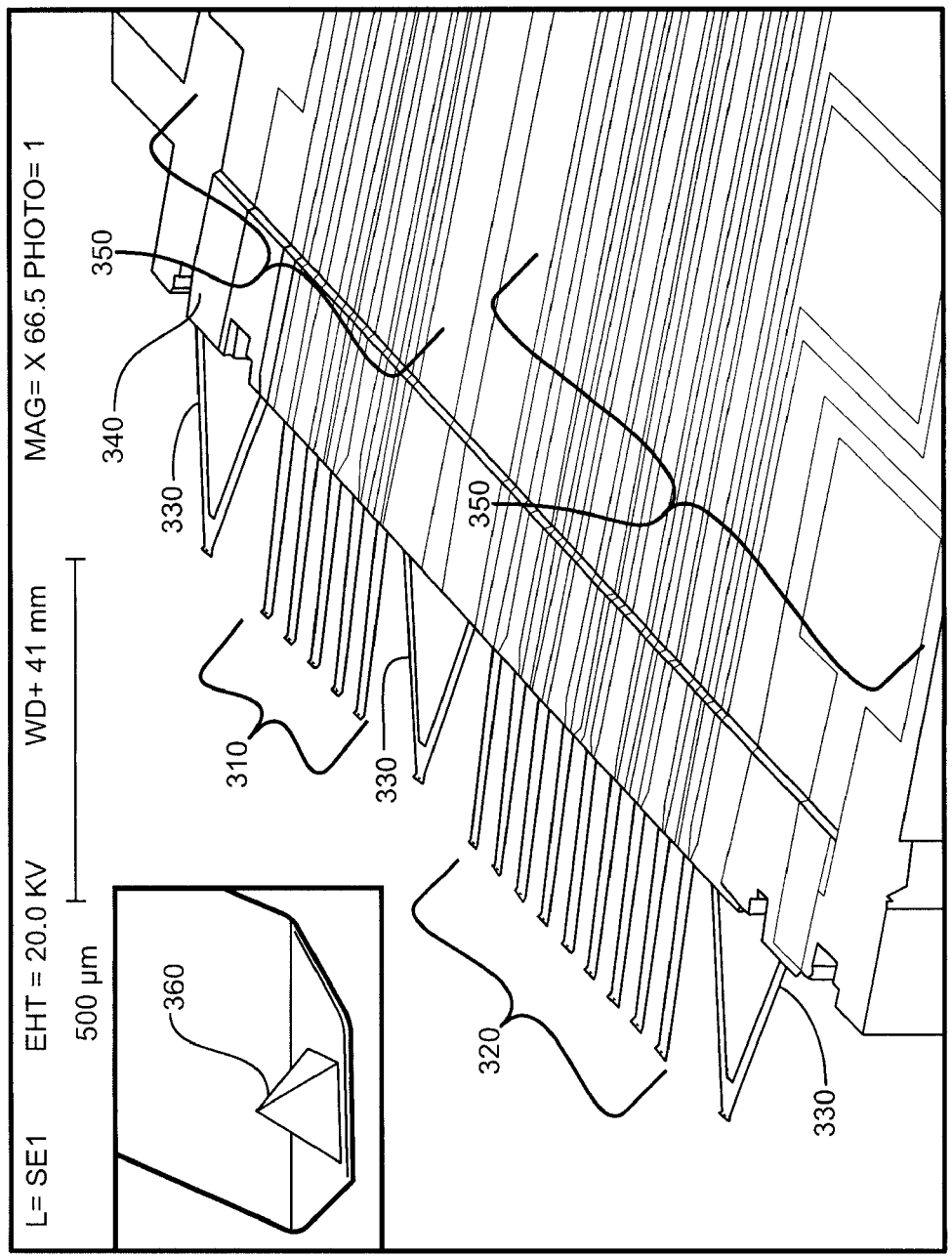
FIG. 3 is a representation of a scanning electron micrograph (SEM) of a multifunctional probe array.

FIG. 3 is a scanning electron micrograph (SEM) of a multifunctional probe array 300. This array contained five DPN probes 310, nine SPCP probes 320, and three reading probes 330 attached to a handle 340 having individual conductive paths 350. The inset is an image of a silicon nitride ($Si_3N_4$) tip 360 with a curvature radius of 100 nm. The DPN probes 310 had rectangular cantilever shanks and $Si_3N_4$ tips, each with a radius of curvature of 100 nm. The SPCP probes 320 had rectangular cantilever shanks and PDMS tips having three different sizes. The PDMS tips included round tips having a radius of curvature of 300 nm, flat tips that were 1 micrometer square, and flat tips that were 5 micrometers square. The reading probes 330 had V-shaped shanks and $Si_3N_4$ tips, each with a radius of curvature of 100 nm. The distance between adjacent rectangular cantilever probes was 100 micrometers, and the distance between V-shaped and rectangular probes was 250 micrometers. The tip-to-tip distances may be further reduced to less than 100 micrometers, for example, to allow for higher probe density or for compatibility with a specific SPM instrument. Rectangular and V-shaped cantilevers are typical probe designs used in scanning probe microscopy and lithography. The sharp $Si_3N_4$ tips may be used to form features smaller than 50 nanometers. The blunt PDMS tips may be used to form coarse features (i.e. micrometer scale) more rapidly than with sharper tips. Multiple tips of the same material and size may offer redundancy or may carry different ink compositions. Since probes 310 and 330 all have sharp $Si_3N_4$ tips, their functions may be interchangeable. For example, any of the 310 and 330 probes may be used for either DPN writing or for reading.

Figure 4A:
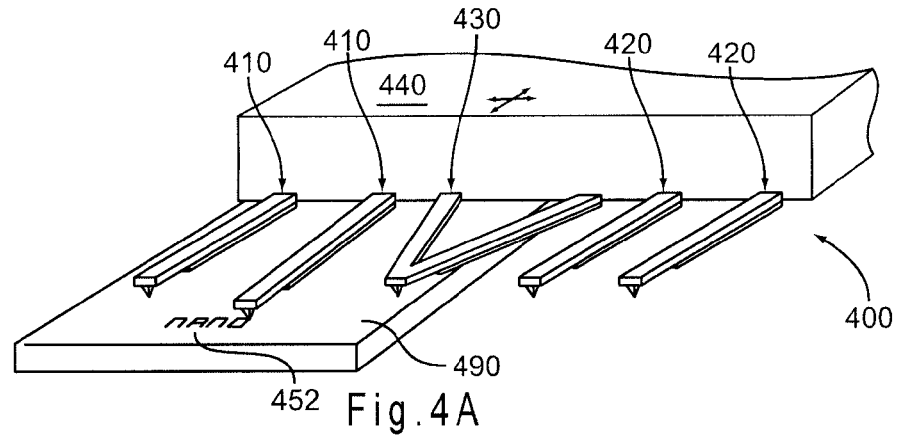
FIG. 4 is a schematic diagram representing sequential operations of writing and reading on a surface using an active multifunctional probe array.
Figure 4B:
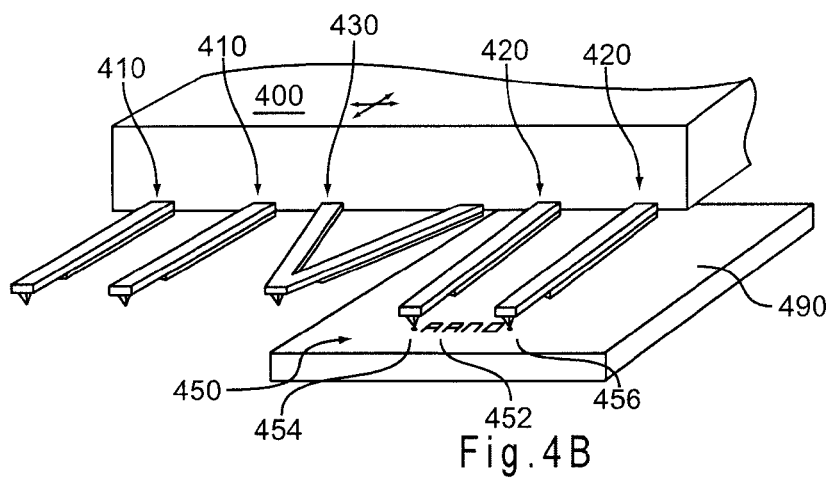
Figure 4C:
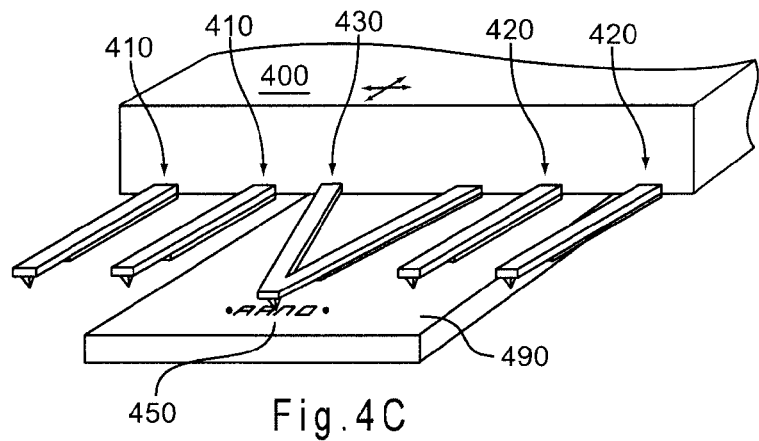

FIG. 4 is a schematic diagram representing sequential operations of writing and reading on a surface 490 using an active multifunctional probe array 400 having two DPN probes 410, two SPCP probes 420, and an AFM probe 430 attached to handle 440. In the array 400, each probe can be actuated independently. In FIG. 4A, one of the DPN probes has applied a nanometer scale line image 452 to the surface. In FIG. 4B, the two SPCP probes have applied micrometer scale or sub-micrometer scale dots 454 and 456 on either side of line image 452, forming a complete image 450. Thus, an image with feature sizes differing by two-order-of-magnitude were formed side-by-side using DPN and SPCP probes in the same array. An image written with a probe array containing at least one DPN probe and at least one SPCP probe may have at least one feature having a minimum dimension less than 100 nanometers, and at least one feature having a minimum dimension greater than 400 nanometers. Preferably an image written with the probe array may have at least one feature having a minimum dimension less than 50 nanometers, and at least one feature having a minimum dimension greater than 400 nanometers; and more preferably may have at least one feature having a minimum dimension less than 25 nanometers, and at least one feature having a minimum dimension greater than 400 nanometers. In FIG. 4C, the AFM probe has scanned the image 450 to read the image.

Writing an image using DPN may include applying an ink to a DPN probe tip, and contacting the probe tip with the surface. Image writing using DPN is described, for example, in U.S. Pat. Nos. 6,635,311 B1 and 6,642,129 B2. The application of ink may include any method that results in the presence of ink on the tip. Typically, DPN probe tips are contacted with an ink well to provide ink on the tip. Ink may also be applied to the tip through a capillary channel in the shank. The use of capillary channels for DPN and SPCP probes is described, for example, in U.S. patent application Ser. No. 10/831,944, filed Apr. 26, 2004, which is incorporated herein by reference. The ink used for SPCP writing may be the same as the ink used for DPN writing using the array, or the inks may have different compositions. If multiple SPCP and/or DPN probes are present in the array, each probe may have an ink composition that is the same as or different from any of the other ink compositions on the other probes.

Writing an image using SPCP may include applying an ink to an SPCP probe tip, and contacting the probe tip with the surface. The application of ink may include any method that results in the presence of ink on the tip. For example, the tip may be contacted with an ink well, with a pad containing ink, or with a separate probe tip having ink on the tip. Ink may also be applied to the tip through a capillary channel in the shank. The ink may then be on the entire probe tip, such that contact of the tip with the surface transfers ink to the surface along the entire area of contact. For tips that are flat, the ink may be present as pixels on the flat tip if the ink source contained ink pixels. In this example, contact of the tip with the surface may transfer ink to the surface only at the pixel locations.

Reading an image using AFM may include monitoring the deflection of the AFM probe as the tip is scanned over the surface while in contact with the surface. By raster scanning the tip over a sample surface area, a local topological map may be produced. In a typical AFM reading process, the repulsive force between the surface and the tip causes the shank to bend, and the amount of bending may be determined, for example by measuring optical deflection of the shank. A specific example of AFM includes lateral force microscopy (LFM).

Because the probes are positioned on the handle at predetermined spacings, the probes do not need to be registered with the surface between each writing and reading step. Instead, the array (i.e. 400, FIG. 4) and/or the surface (i.e. 490, FIG. 4) is displaced laterally by a distance based on the spacing between the relevant probes and the desired image. Their relative displacement may be achieved by moving the probe array and/or the surface. In addition, no vertical displacement is necessary during the process. For a particular writing or reading step, only the probe or probes involved in the step are in a lowered position to contact the surface. The terms "contact the surface" or "contacting the surface" each mean that a probe tip is sufficiently close to the surface to allow ink to be transferred from the tip to the surface, or to allow a force measurement or other measurement that can be correlated with a reading signal.

Probes having tips of different materials have not been integrated previously, possibly due to the incompatibility of the fabrication processes for the various tips. For example, formation of a rigid silicon nitride AFM tip typically requires plasma enhanced chemical vapor deposition (PECVD) at 300° C.; but an elastomeric polysiloxane SPCP tip will degrade at these temperatures. It has now been discovered that a mold-and-transfer fabrication technique may allow for multiple tip materials and/or multiple tip shapes to be incorporated in one array. Examples of the materials and processes used in a mold-and-transfer fabrication are disclosed, for example, in Zou, J.; Wang, X.; Bullen, D.; Ryu, K.; Liu, C.; Mirkin, C. A. *J. Micromech. Microeng.* 2004, 14, 204-211, and in U.S. Patent Application Publication 2004/0227075 A1.

Figure 5:
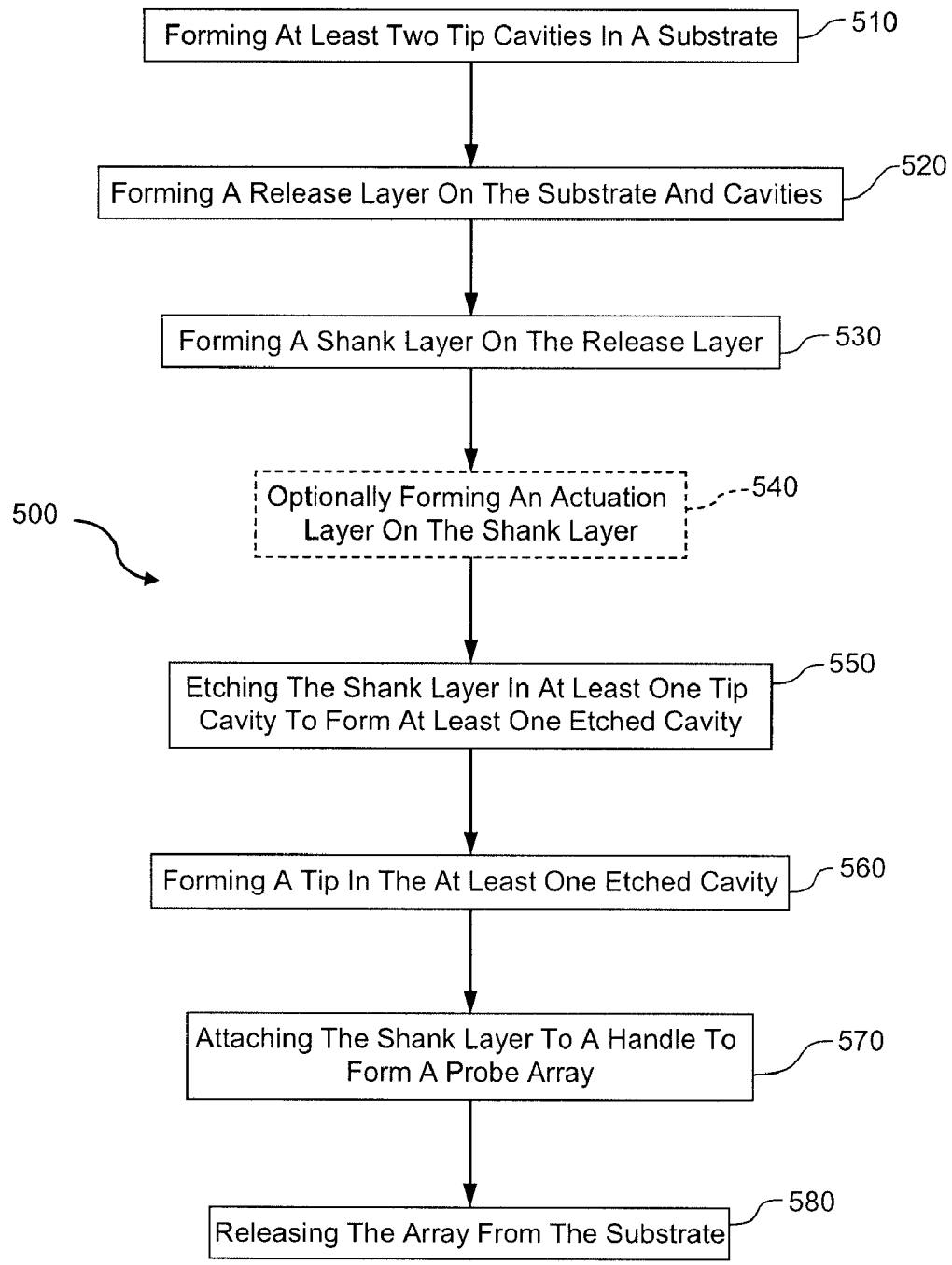
FIG. 5 represents a method of making a probe array.

FIG. 5 represents a method 500 of making a probe array that includes forming at least two tip cavities in a substrate 510, forming a release layer on the substrate and cavities 520, forming a shank layer on the release layer 530, optionally forming an actuation layer on the shank layer 540, etching the shank layer in at least one tip cavity to form at least one etched cavity 550, forming a tip in the at least one etched cavity 560, attaching the shank layer to a handle to form a probe array 570, and releasing the array from the substrate 580. The probe array includes a first tip having a first tip material, and a second tip having a second tip material different from the first tip material.

Forming at least two tip cavities in a substrate 510 may include forming a mask layer on a substrate and etching the substrate. Examples of substrates that can be used for making a probe array include substrates typically used in semiconductor structure fabrication, such as silicon, germanium, gallium arsenide, gallium nitride, aluminum phosphide, $Si_{1-x}Ge_x$ and $Al_xGa_{1-x}As$ alloys, where x is from zero to one. Preferably the substrate is silicon, and more preferably is single crystal silicon, such as a {110} single crystal silicon wafer. Forming a mask layer on a substrate may include forming a mask layer material on the substrate and patterning the mask layer materials to expose a portion of the substrate. Examples of mask layer materials include photoresists, oxide layers such as silicon oxide, and nitride layers such as silicon nitride. The mask layer may be patterned by conventional lithographic techniques to form openings in the mask layer material through which the substrate is exposed.

Etching the substrate may include exposing the substrate and mask layer to an etching agent that selectively etches the substrate, with little or no etching of the mask layer. As the exposed substrate material is removed at a particular point, a cavity is formed in the substrate. The size and shape of the cavity may be determined by the shape of the opening in the mask layer, by the type of etching agent used, and by the length of time the substrate is exposed to the etching agent. For a single crystal silicon substrate, it is preferred that the etching agent removes silicon anisotropically, and it is more preferred that the etching agent removes silicon in a manner that is dependent on the crystal orientation. For example, if an area of {110} single crystal silicon is exposed to an etching agent that is crystal orientation selective, then the cavity may have an inverted pyramidal shape. The inverted pyramid may have a flat bottom corresponding to a {100} crystal plane if the etch time is below a certain threshold, or it may have a sharp point if the etch time is above a certain threshold.

Forming a release layer on the substrate and cavities 520 may include removing the mask layer from the substrate and forming a layer of release material on the substrate and cavities. The mask layer may be removed chemically, for example by exposure to a solvent that dissolves the mask layer or by exposure to an etching agent that selectively removes the mask layer but not the substrate. The release material may be deposited directly onto the substrate and cavities, or a precursor material may be deposited onto the substrate and cavities, and the precursor material may then be converted into the release material. The release layer may be formed over the entire substrate, or it may be formed in a pattern on the cavities and portions of the substrate.

The release material may be any material that is different from the substrate and the shank material. Preferably the release material is not degraded by the subsequent processing steps until the product is ready to be removed from the substrate. Examples of release materials include materials that are thermally stable but that can be degraded by contact with acidic or basic substances. Specific examples of release materials include zinc oxide (ZnO) and aluminum. These materials may be directly applied to the substrate and cavities by sputtering. The thickness of the release layer may be from 1 nanometer to 100 micrometers, and preferably is from 10 nanometers to 1 micrometer.

Forming a shank layer on the release layer 530 may include applying a layer of shank material directly, or it may include applying a layer of a precursor to the shank material and then converting the precursor into the shank material. Examples of shank materials include silicon; metals such as permalloy, copper, tungsten, titanium, aluminum, silver, and gold; oxides such as silicon dioxide, silicon oxide, and silicon oxynitride; nitrides such as silicon nitride and titanium nitride; and polymers such as polyimide, parylene, and SU-8 epoxy. Preferably the shank material is $Si_3N_4$, which may be directly applied by physical vapor deposition (PVD) or chemical vapor deposition (CVD), including PECVD.

Optionally forming an actuation layer on the shank layer 540 may include forming a layer that can contribute to deflection of the shank material under an appropriate stimulus. For example, a piezoelectric layer may be formed on the shank layer. In another example, an electrostatically sensitive layer may be formed on the shank layer. In yet another example, a resistive heating layer may be formed on the shank layer. Preferably an actuation layer is formed on the shank layer. More preferably the actuation layer includes a layer of resistive heating material, and more preferably includes gold or Cr/Au. The actuation layer may be formed in a pattern on the shank layer, or the actuation layer may be formed and then patterned. In one example, a resistive heating material is applied to the shank layer, patterned, and then overlaid with another layer of shank material. An overlaid layer of shank material may help insure that the actuation layer does not disconnect from the shank during operation.

Etching the shank layer in at least one tip cavity to form at least one etched cavity 550 may include patterning the shank layer into a plurality of shank shapes. For example, an individual shank shape may extend from a proximal end to a distal end, where the distal end surrounds a cavity. The shank shapes may be discrete, or two or more of the shank shapes may be connected at the proximal end. Patterning of the shank layer may be performed by conventional lithographic techniques. The pattern of the shank layer after etching includes at least one cavity in which the release layer is exposed. If the tip materials for all the probes are to be different from the shank material, then all the cavities may be etched to expose the release layer.

Forming a tip in at least one etched cavity 560 may include applying a tip material to the etched cavity, or it may include applying a precursor to the tip material to the etched cavity and then converting the precursor into the tip material. Excess tip material or precursor material may be applied and then mechanically removed from the surface of the shank material and/or substrate. A variety of tip materials may be formed, each material in a different etched cavity. For example, different polymeric tips may be formed by applying different polymers or polymer precursors to areas surrounding individual etched cavities. Examples of tip materials include silicon; metals such as permalloy, copper, tungsten, titanium, aluminum, silver, and gold; oxides such as silicon dioxide, silicon oxide, and silicon oxynitride; and nitrides such as silicon nitride and titanium nitride. Examples of tip materials include polymers such as polyimide; parylene; SU-8 epoxy; and elastomers, including polysiloxanes, such as PDMS, and polyolefins, such as polybutadiene, polyisoprene and EPDM. If the tip material for a particular probe is the same as the shank material, then the cavity for the shank does not need to be etched during the etching of the shank layer 550. In this example, the tip and the shank are integral.

Attaching the shank layer to a handle to form a probe array 570 may include chemically or mechanically attaching the shank layer to the handle. Chemical attachment includes application of an adhesive layer between the shank layer and the handle. Chemical attachment also includes application of a bonding stimulus to the shank layer and handle when the layer and handle are in contact. Examples of bonding stimuli include heat, electrical current, electromagnetic induction, and vibration. Mechanical attachment includes fasteners, tongue and groove attachments, and the like.

Releasing the array from the substrate 580 may include treating the release layer with a reagent that dissolves or degrades the release material. For example, the release layer may be contacted with a solvent that dissolves the release material but that does not dissolve the materials present in the array. In another example, the release layer may be contacted with an etching agent or an acidic or basic solution that preferentially degrades the release material but that does not degrade the materials present in the array. Preferably the reagent used to dissolve or degrade the release material does not dissolve or degrade the substrate, so that the substrate and cavities can be used again for formation of another array.

Figure 6:
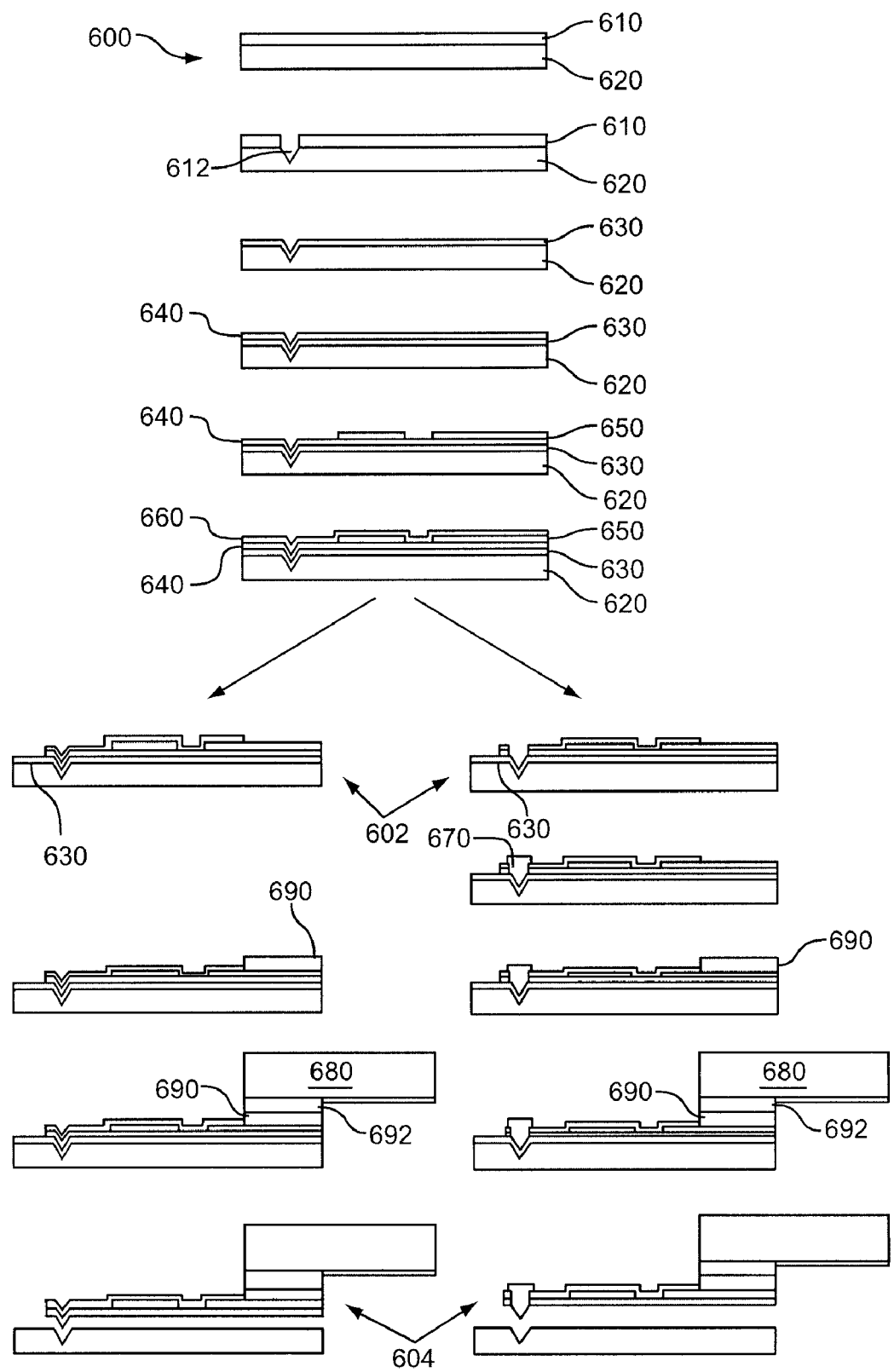
FIG. 6 is a schematic diagram representing an exemplary method of making a probe array.

An example of the method of making a probe array is represented schematically in FIG. 6. This product of this example included three different types of probes in a single multifunctional probe array. Each probe had a silicon nitride shanks and a tip made either of silicon nitride or PDMS. Each probe in this array could be individually addressed to a surface by thermal actuation. The method of making a probe array may be used to provide arrays containing a wide variety of different tip materials, shank materials, and probe actuators.

The following examples are provided to illustrate one or more preferred embodiments of the invention. Numerous variations may be made to the following examples that lie within the scope of the invention.

EXAMPLES

Example 1

Fabrication of Multifunctional Probe Array

FIG. 6 represents the method used to fabricate the multifunctional probe array shown in FIG. 3. A {100} single crystal silicon (Si) wafer was oxidized to form a chip 600 having a layer of silicon oxide ($SiO_2$) 610 on a {100} single crystal Si substrate 620. The $SiO_2$ layer 610 was patterned to open small square windows of various sizes in the oxide, and the patterned oxide was then used as an etch mask for the Si substrate 620. The chip was treated with a preferential Si etchant solution of ethylene diamine and pyrocatechol (EDP) at 95° C. The EDP etching of Si was anisotropic and crystal-orientation-dependent. After a timed etch, cavities 612 were formed in the Si substrate 620 bounded by {111} planes. Depending on the etching time and the sizes of openings in the $SiO_2$ layer, the cavities ended in a sharp point or had flat bottoms ({100} crystal plane). These cavities were used as masters to mold probe tips in subsequent processes.

The $SiO_2$ mask layer 610 was removed by treatment with buffered hydrofluoric acid, and a thin layer of zinc oxide (ZnO) 630 was then sputtered on the entire substrate 620. Since ZnO is readily etched by most acids with fast etch rate, it served as a release layer. A thin $Si_3N_4$ layer (0.2 μm thick) 640 was deposited on top of the ZnO layer. Metal thin films 650 and 652 were then evaporated and patterned to form resistive actuator elements. Another $Si_3N_4$ layer (0.8 μm thick) 660 was deposited and patterned to form probe shanks. The two $Si_3N_4$ layers sandwiched the metal actuator in between to prevent detachment of the metal films 650 and 652 from $Si_3N_4$ layer 640. Thermal actuation action was achieved by the difference of thermal expansion of the metal and the $Si_3N_4$ layers.

Two types of probes having tips of different materials were formed on a single chip 602. For probes having $Si_3N_4$ tips, the tip was part of the $Si_3N_4$ layers 640 and 660. These probes were particularly useful for DPN writing and AFM reading. For probes with PDMS tips, the $Si_3N_4$ layers 640 and 660 were etched to form openings at the distal ends of the cantilevers, exposing the underlying release layer 630. A layer 670 of a liquid precursor for PDMS was deposited on the chip 602, and excess liquid was removed using a rubber blade, leaving PDMS precursor only in the cavities 612. The chip was then heated at 90° C. for 30 minutes to cure the PDMS.

A handle in the form of a holder chip 680 was fabricated separately and contained conductive wires. Indium (In) solder bumps 690 and 692 were electroplated on both chip 602 and the holder chip 680. The bonding sites provided both electrical connection and mechanical anchoring between the probes and the holder chip. Indium was selected as the bonding material due to its low melting temperature (156.6° C.), since the presence of cured PDMS tips prohibits the use of process temperatures above 200° C. The two chips 602 and 680 were aligned and temporarily bonded together on a contact aligner. The two chips were permanently bonded in a nitrogen environment by reflowing the indium at a temperature close to its melting point. The final probe array chip 604 was released by dissolving the ZnO release layer 630 in sulfamic acid. The probe array chip had 17 tips, including five rectangular DPN probes with $Si_3N_4$ tips of 100 nm curvature radius, nine rectangular SPCP probes with PDMS tips of three different sizes (300 nm round tip, 1 micrometer flat top, and 5 micrometer flat top), and three V-shaped reading probes with $Si_3N_4$ tips of 100 nm curvature radius. The distance between adjacent rectangular cantilever probes was 100 micrometers, and the distance between V-shaped and rectangular probes was 250 micrometers.

Example 2

Writing and Reading with Multifunctional Probe Array

Micro and nanolithography tests using the probe array of Example 1 were conducted on a Thermomicroscopes AutoProbe M5 AFM machine using 1-octadecanethiol (ODT) as ink. The ink was coated on the probe tips using a contact inking method. A gold-coated silicon chip was used as the writing surface. The writing surface was mounted on a calibrated, high-precision XY stage, which provided in-plane motions with nanoscale resolution. The tip-to-tip distances of the probes in the probe array were measured using a scanning electron microscope. The probe array was mounted on the AFM scanning head and brought into contact with the writing surface. In the lithography process, the XY stage was used to displace the writing surface by a distance corresponding to the tip and the desired image spacings for achieving image registration. A wide variety of images were formed with the probe array and were read with the same array.

Figure 7A:
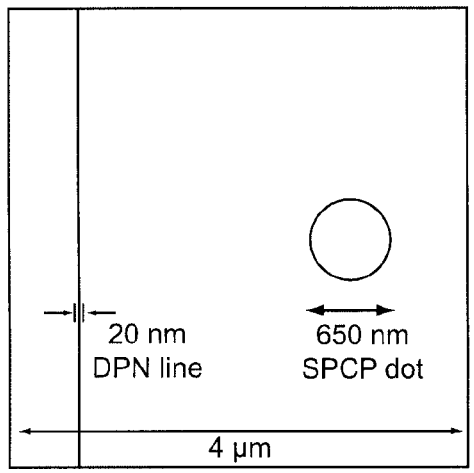
FIGS. 7A and 7B are representations of lateral force microscopy (LFM) micrographs of images formed using a multifunctional probe array.
Figure 7B:
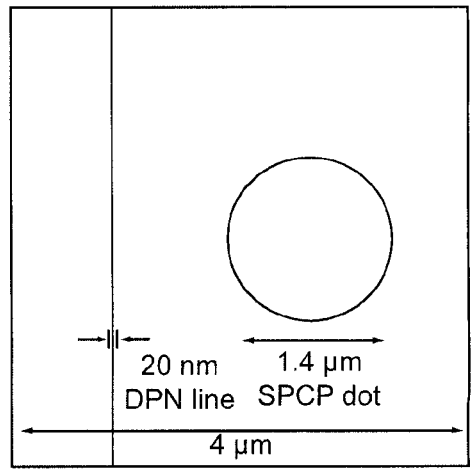

FIGS. 7A and 7B are lateral force microscopy (LFM) micrographs of nanoscale images formed using DPN and SPCP probes of the array. Each micrograph is 4 micrometers by 4 micrometers. FIG. 7A is a micrograph of a line having a width of 20 nm generated by a $Si_3N_4$ DPN tip, together with a dot having a diameter of 650 nm generated by a PDMS SPCP tip with 300 nm curvature radius. FIG. 7B is a micrograph of a line having a width of 20 nm generated by a $Si_3N_4$ DPN tip and a dot having a diameter of 1.4 micrometers generated by a SPCP tip with a 1 micrometer×1 micrometer flat top. The writing speed for the line images was 0.1 micrometer per second, and the tip-surface contact time for the dot images was 1 minute.

Figure 8:
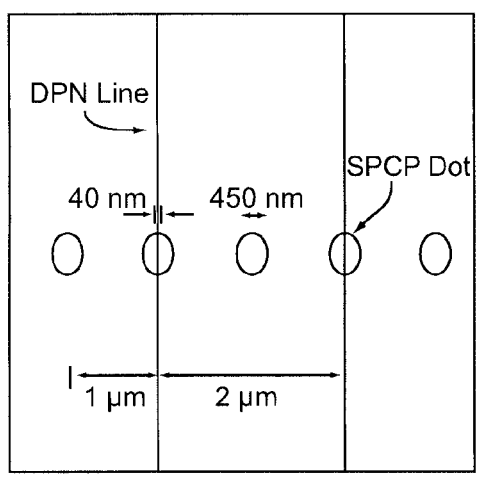
FIG. 8 is a representation of an LFM micrograph of an image formed using a multifunctional probe array.

Since the tip-to-tip distance between the different types of probes was known, accurate registration between images generated by the different probes was achieved. FIG. 8 is an LFM micrograph (5 micrometers by 5 micrometers) of a nanoscale image formed using DPN and SPCP probes of the array. The lines were generated first using a $Si_3N_4$ DPN probe. The surface was then moved for a predetermined distance corresponding to the distance between the two tips, and the PDMS SPCP tip was used to print dots on the lines. The dots were 450 nm in diameter with 1 micrometer spacing, and the lines were 40 nm wide with 2 micrometers spacing. The alignment error between lines and dots was about 50 nm.

Figure 9:
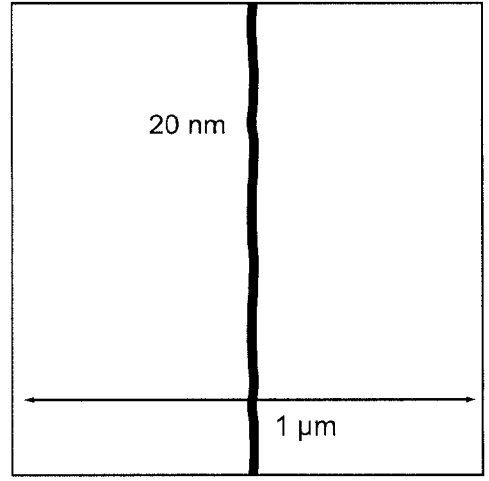
FIG. 9 is a representation of an LFM micrograph of a line image written by a DPN probe, where the micrograph was generated by a reading probe in the same multifunctional probe array.

With the writing and reading probes in the same array, images generated by the DPN or SPCP probes could be read immediately after their formation. FIG. 9 is an LFM micrograph (1 micrometer by 1 micrometer) of a line having a width of 20 nm generated by a DPN probe, where the micrograph was generated by a reading probe in the same probe array. No evidence of cross-contamination was found.

While various embodiments of the invention have been described, it will be apparent to those of ordinary skill in the art that other embodiments and implementations are possible within the scope of the invention. Accordingly, the invention is not to be restricted except in light of the attached claims and their equivalents.

What is claimed is:

1. A probe array, comprising:
    means for performing scanning probe contact printing,
    means for performing dip pen nanolithography, and
    means for forming an image using the means for performing scanning probe contact printing and the means for performing dip pen nanolithography, wherein the means for performing scanning probe contact printing has radius of curvature of at least 300 nm, and wherein the means for performing dip pen nanolithography printing has radius of curvature less than 300 nm.

2. The array of claim 1, further comprising means for performing atomic force microscopy,
    where the means for forming an image comprises means for subsequently reading the image using the means for performing atomic force microscopy.

3. The array of claim 2, where the means for forming an image comprises a handle connected to the means for performing scanning probe contact printing, to the means for performing dip pen nanolithography and to the means for performing atomic force microscopy.

4. The array of claim 3, where the means for forming an image further comprises means for individually adjusting the orientation of the means for performing scanning probe contact printing, of the means for performing dip pen nanolithography and of the means for performing atomic force microscopy, relative to the handle.

5. A method of writing using the array of claim 2, comprising:
    performing scanning probe contact printing on a surface to form a first image,
    performing dip pen nanolithography on the surface to form a second image, and
    performing atomic force microscopy to read the first and second images.

6. The method of claim 5, where the first image comprises a first composition, and the second image comprises a second composition different from the first composition.

7. The method of claim 5, where the first image has a first minimum dimension, and the second image has a second minimum dimension different from the first minimum dimension.

8. The array of claim 1, where the means for forming an image comprises a handle connected to the means for performing scanning probe contact printing and to the means for performing dip pen nanolithography.

9. The array of claim 8, where the means for forming an image further comprises means for individually adjusting the orientation of the means for performing scanning probe contact printing and of the means for performing dip pen nanolithography, relative to the handle.

10. A method of writing using the array of claim 1, comprising:
    performing scanning probe contact printing on a surface to form a first image, and
    performing dip pen nanolithography on the surface to form a second image.

11. The method of claim 10, where the first image comprises a first composition, and the second image comprises a second composition different from the first composition.

12. The method of claim 10, where the first image has a first minimum dimension, and the second image has a second minimum dimension different from the first minimum dimension.

13. A probe array, comprising:
    means for performing scanning probe contact printing,
    means for performing atomic force microscopy, and
    means for forming an image using the means for performing scanning probe contact printing, and for subsequently reading the image using the means for performing atomic force microscopy, wherein the means for performing scanning probe contact printing has radius of curvature of at least 300 nm, and wherein the means for performing dip pen nanolithography printing has radius of curvature less than 300 nm.

14. The array of claim 13, where the means for forming an image comprises a handle connected to the means for performing scanning probe contact printing and to the means for performing atomic force microscopy.

15. The array of claim 14, where the means for forming an image further comprises means for individually adjusting the orientation of the means for performing scanning probe contact printing and of the means for performing atomic force microscopy, relative to the handle.

16. A method of writing using the array of claim 13, comprising:
    performing scanning probe contact printing on a surface to form an image, and
    performing atomic force microscopy to read the image.

* * * * *

UNITED STATES PATENT AND TRADEMARK OFFICE
CERTIFICATE OF CORRECTION

| | | |
|---|---|---|
| PATENT NO. | : 7,523,650 B2 | Page 1 of 1 |
| APPLICATION NO. | : 11/779637 | |
| DATED | : April 28, 2009 | |
| INVENTOR(S) | : Xuefeng Wang et al. | |

It is certified that error appears in the above-identified patent and that said Letters Patent is hereby corrected as shown below:

Title Page; item (56);

On Page 2, under U.S. Patent Documents

Please insert --2007/0062264 A1    03/2007    Wang et al.--

Signed and Sealed this

Eighth Day of September, 2009

David J. Kappos
*Director of the United States Patent and Trademark Office*